United States Patent [19]

Witucki et al.

[11] Patent Number: 5,393,610
[45] Date of Patent: Feb. 28, 1995

[54] STABILIZING SHELF LIFE CONDUCTIVITY OF CONDUCTIVE SUBSTRATE COATINGS

[75] Inventors: Edward F. Witucki, Van Nuys, Calif.; William P. Moran, Tulsa, Okla.; Patricia H. Cunningham, Thousand Oaks, Calif.; Lyle V. Monney, Bixby, Okla.

[73] Assignee: Rockwell International Corporation, Seal Beach, Calif.

[21] Appl. No.: 14,439

[22] Filed: Feb. 5, 1993

Related U.S. Application Data

[62] Division of Ser. No. 693,259, Apr. 29, 1991, Pat. No. 5,198,266.

[51] Int. Cl.$^6$ ............................................. B32B 17/06
[52] U.S. Cl. .................................. 428/447; 428/263; 428/266; 428/268; 428/289; 428/312.6; 428/379; 428/383; 428/389; 428/391; 428/392; 428/429; 428/436; 428/524; 428/922
[58] Field of Search .............. 428/263, 266, 268, 289, 428/379, 383, 389, 391, 392, 312.6, 429, 436, 524, 922, 447; 427/387, 380, 381, 385.5, 389.8, 393.5, 407.1, 407.3, 412.1, 412.5, 419.7, 443.2

[56] References Cited

U.S. PATENT DOCUMENTS 4,617,228 10/1986 Newman et al. ................... 428/265
4,692,225 9/1987 Witucki et al. ....................... 204/59
5,002,824 3/1991 Warren ............................... 428/290

Primary Examiner—D. S. Nakarani
Attorney, Agent, or Firm—Lawrence N. Ginsberg; Max Geldin; Charles T. Silberberg

[57] ABSTRACT

A method for stabilizing shelf life conductivity of conductive coatings such as polypyrrole or nickel sulfide on a substrate such as fiberglass, by incorporating in such conductive coating a polyphenol or a polysiloxane. The polyphenol is derived from a phenolic material in the form of a phenol-formaldehyde monomer or an oligomer of phenol-formaldehyde, and the polysiloxane is derived from a siloxane. Upon heating, the phenolic material cures to a polyphenol and the siloxane is converted to a polysiloxane, forming the stabilizing material on the conductive polypyrrole or nickel sulfide coated substrate. The phenolic material is preferably incorporated directly into the solution formulation for preparing the conductive nickel sulfide or polypyrrole on the substrate, and the polyphenol stabilizer is formed together with the conductive coating on the substrate by heating. In the case of the silane or siloxane material, the conductive polypyrrole or nickel sulfide preferably is formed first on the substrate, and the conductive coated substrate is contacted with a solution of the siloxane followed by heating to convert the siloxane to a polysiloxane protective overcoating.

5 Claims, 1 Drawing Sheet

STABILITY OF NEAT AND SILANE PROTECTED NICKEL SULFIDE FOR 30 DAYS AT ROOM TEMPERATURE FOR TWO LEVELS OF SHEET RESISTIVITY

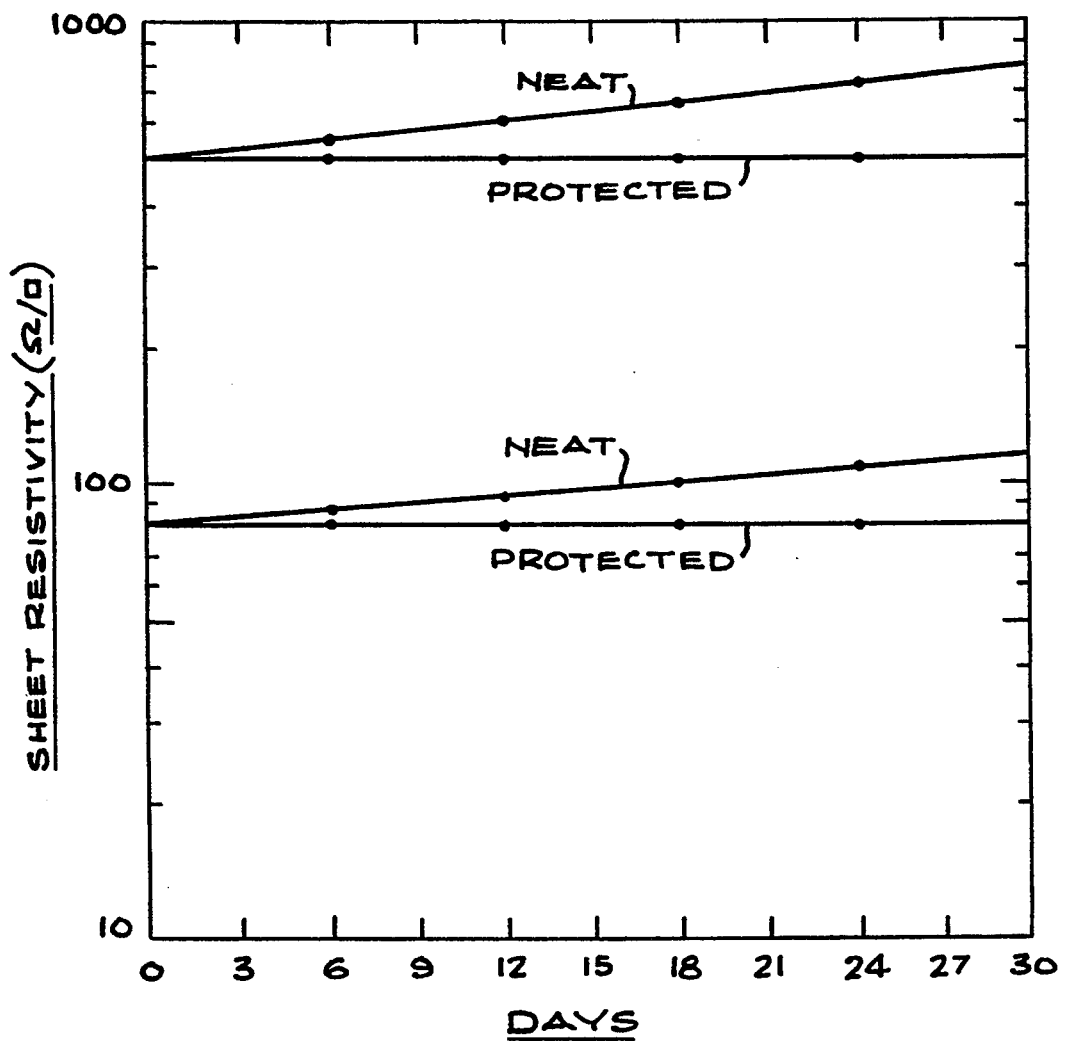
STABILITY OF NEAT AND SILANE PROTECTED NICKEL SULFIDE FOR 30 DAYS AT ROOM TEMPERATURE FOR TWO LEVELS OF SHEET RESISTIVITY

STABILIZING SHELF LIFE CONDUCTIVITY OF CONDUCTIVE SUBSTRATE COATINGS

This is a divisional of application Ser. No. 07/693,259, filed on Apr. 29, 1991, now U.S. Pat. No. 5,198,266.

BACKGROUND OF THE INVENTION

This invention relates to stabilization of shelf life conductivity of conductive organic and inorganic coatings, and is particularly directed to a method of stabilizing shelf life conductivity of conductive substrate coatings of polypyrrole and nickel sulfide.

Conductive coatings can be made from organic conductive polymers such as polypyrrole or from inorganic conductive material such as nickel sulfide. These conductive coatings can be readily impregnated into substrate materials such as fiberglass, as disclosed in U.S. Pat. No. 4,617,228 to Newman et al, and in U.S. application Ser. No. 394,260, filed Aug. 7, 1989, issued as U.S. Pat. No. 5,002,824 to Warren, and assigned to the same assignee as the present application, and the resulting coated substrate is subsequently laminated to make conductive composite structural materials and parts.

It has been demonstrated that these conductive substrate impregnated coatings are not completely electrically stable in the neat unprotected state, a condition which is unacceptable when being held on the shelf awaiting lamination.

U.S. Pat. No. 4,692,225 to Witucki et al discloses a method of stabilizing electrically conductive polymers such as polypyrrole to hostile environments. The method comprises encapsulating the conductive polymer, e.g. polypyrrole, preferably in the form of a composite of a substrate, such as fiberglass fabric, impregnated with the conductive polymer, with an epoxy, polyimide or bismaleimide resin, as an encapsulating agent. The preferred method involves pre-pregging the fabric of the conductive composite with an epoxy resin and curing the resulting system.

It is an object of the present invention to provide a novel method of stabilizing shelf life conductivity of conductive organic polymers such as polypyrrole, or conductive inorganic materials such as nickel sulfide, on a substrate.

Another object of the invention is the provision of procedure for stabilizing shelf life conductivity of polypyrrole or nickel sulfide conductive coatings on a substrate, by incorporating certain protective materials into such coatings or by providing an overcoating of certain protective materials.

A still further object is to provide a process for stabilizing the shelf life conductivity of a substrate, such as fiberglass fabric, impregnated with conductive polypyrrole or conductive nickel sulfide.

A still further object is the provision of improved shelf life stabilized conductive substrate coatings of polypyrrole or nickel sulfide.

SUMMARY OF THE INVENTION

According to the invention, there is provided a method for stabilizing shelf life conductivity of conductive substrate coatings of polypyrrole or nickel sulfide, by incorporating a polyphenol or a polysiloxane into such conductive coatings and forming a protective material. The protective material is formed by heating the substrate containing a phenolic material or a silane for a time sufficient to form the polyphenol or the polysiloxane.

Thus, the shelf life stabilization procedure to form the protective material or stabilizer of the invention can be carried out by the inclusion of a low temperature curing phenolic material, e.g. in the form of a phenol-formaldehyde monomer or an oligomer of phenol-formaldehyde, into the solutions for forming the original conductive coating such as nickel sulfide on the substrate, and subsequently heating to form the nickel sulfide and also curing the phenolic material to form the protective material integral to the conductive coating. Alternatively, the substrate containing the impregnated conductive coating, e.g. polypyrrole or nickel sulfide, can be contacted with a silane material, particularly a siloxane, which is heated at low temperature to form a protective polysiloxane overcoating on the conductive coating.

The shelf life conductivity of the conductive polypyrrole or nickel sulfide substrate coatings protected according to the present invention remains stable and substantially constant over an extended period of time.

BRIEF DESCRIPTION OF THE DRAWING

The FIGURE in the drawing is a plot illustrating the relative shelf life stability of neat and protected nickel sulfide conductive coatings according to the invention.

DETAILED DESCRIPTION OF THE INVENTION AND PREFERRED EMBODIMENTS

In the invention process a non-porous or a porous dielectric material is employed as a substrate for deposition of the conductive coating. Preferably, a porous dielectric or electric insulating material can be used as substrate, such as a porous ceramic, a porous glass, e.g. a frit, a porous organic foam, e.g. polyurethane, a fabric, which can be woven or non-woven, e.g., fiberglass fabric, a mixed oxide fabric, such as an alumina-silica-boria fabric, e.g. Nextel, or the silicon carbide fabric marketed as Nicalon, or a synthetic organic fabric, such as Kevlar, a trademark of the DuPont Company for aromatic polyamide fiber, a polyester such as Dacron cloth or Mylar, a polyimide, and the like.

The conductive polypyrrole coated substrates or composites can be produced by a chemical process which comprises contacting a dielectric, e.g. porous substance, as noted above with a liquid pyrrole, contacting the porous substance with a solution of a strong oxidant capable of oxidizing pyrrole to a pyrrole polymer and oxidizing the pyrrole in the presence of a substantially non-nucleophilic anion, and precipating a conductive pyrrole polymer in the pores of said substance.

The liquid pyrrole treating solution can comprise a neat liquid pyrrole or a C-substituted pyrrole such as a 3- or 3,4-alkyl or aryl-substituted pyrrole, e.g., 3-methylpyrrole, or an N-substituted pyrrole such as an N-alkyl pyrrole or an N-aryl-pyrrole, e.g., N-methylpyrrole. The pyrrole solution may or may not contain a solvent, such as alcohols, dioxane and acetonitrile. Water also can be employed.

The oxidation of pyrrole or a substituted derivative thereof to produce the conductive pyrrole polymer is carried out in the presence of a strong oxidant, such as the ferric or cupric cation, e.g., as provided by ferric perchlorate or cupric fluoroborate.

A material providing substantially non-nucleophilic anions functioning as dopant for the pyrrole polymer is also employed, e.g., sulfate, bisulfate, fluoroborate, chloride and the like, provided by compounds, such as sulfuric acid, sodium sulfate and sodium bisulfate.

The oxidant and the non-nucleophilic anion can be provided by the same compound, e.g., as in ferric chloride. In preferred practice, the non-nucleophilic anion is present in the oxidant solution.

The above described process for producing electrically conductive polypyrrole on a substrate is described in the above U.S. Pat. No. 4,617,228, and such disclosure is incorporated herein by reference.

The electrically conductive nickel sulfide coated substrates or composites can be produced by contacting a dielectric non-porous or porous dielectric substrate, of the types noted above, such as fiberglass fabric, with an aqueous or non-aqueous solution containing a soluble nickel salt and a sulfur donor, drying the resulting wet substrate at ambient temperature, and heating the resulting substrate at elevated temperature of about 100° C. to about 400° C.

The nickel salts employed in the preferably aqueous treating solution can include nickel sulfate, nickel chloride, nickel acetate, nickel nitrate, nickel tetrafluoroborate, and the like. The concentration of the nickel salt in the treating solution can range from about 0.01 to about 2 molar.

The sulfur donor or sulfur releasing substance can include an alkali metal thiosulfate, such as sodium and potassium thiosulfate, ammonium thiosulfate, thioacetamide, thiophosphate salts such as sodium thiophosphate and ammonium thiophosphate, thiourea, and the like. The concentration of the sulfur donor in the treating solution is generally within the same range of concentration as the concentration of the nickel salt.

While aqueous treating solutions of the soluble nickel salt and sulfur donor are generally employed, organic solutions, e.g. methanol solutions can also be employed.

The above process for producing conductive nickel sulfide coated substrates is described in above U.S. application Ser. No. 394,260 and is incorporated herein by reference. As noted therein, the nickel sulfide conductive coating formed therein is formulated as $NiS_x$ rather than pure NiS, due to its apparently polymeric nature.

When forming the protective overcoating according to the invention, the phenolic or silane material can be incorporated into the initial solution for forming the electrically conductive polypyrrole, or the electrically conductive nickel sulfide. A substrate such as fiberglass is then contacted with such solution, as by dipping or spraying such solution, followed by heating to form the conductive nickel sulfide and to convert the phenolic material or the silane to a polyphenol or a polysiloxane. In the case of the polypyrrole, this conductive coating is formed initially from the above noted pyrrole and oxidant components without heating. This is the preferred procedure particularly for the production of a polyphenol protective material in an electrically conductive polypyrrole or nickel sulfide substrate coating, since the substrate is impregnated with the material for producing both the electrically conductive material and the protective coating in a single step. In this method, the protective polyphenol or polysiloxane product is integral to the conductive coating.

Alternatively, the substrate can be contacted first with the solution for making the electrically conductive polypyrrole or nickel sulfide, the substrate dried, and heated in the case of nickel sulfide, to form the conductive polypyrrole or nickel sulfide impregnated in the substrate, followed by contacting the electrically conductive substrate with a solution of the phenolic material or the siloxane material and the resulting impregnated conductive substrate heated to form a protective polyphenol or polysiloxane protective overcoating on the electrically conductive polypyrrole or nickel sulfide coating. This is the preferred procedure for applying a polysiloxane protective overcoating on a conductive polypyrrole or nickel sulfide substrate coating.

Thus, for example, in the protection of conductive nickel sulfide by means of a polyphenolic material according to preferred practice in the present invention, a phenol-formaldehyde monomer or an oligomer of phenol-formaldehyde is incorporated directly into the solution containing the soluble nickel salt, e.g. nickel acetate, and the sulfur donor, e.g. thiourea, for production of nickel sulfide. In preferred practice oligomers of phenol and formaldehyde can be employed. Examples of such oligomers of phenol and formaldehyde are the materials marketed as SC-1008, which is an organic solvent soluble material, and RL-2395, which is a water soluble material, both marketed by Borden Company. The general formula for such phenol-formaldehyde and its oligomers is

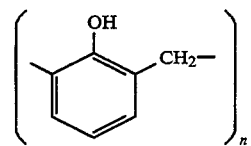

where n can be 1 to 50.

When an insulating substrate such as fiberglass is contacted as by dipping into or sprayed with a solution of a soluble nickel salt such as nickel acetate, a sulfur donor such as thiourea and the phenolic material, e.g. SC-1008, the treated substrate dried, and then heated, e.g. at temperature of 300°–400° F. (150°–205° C.). Under these heating conditions, both the nickel sulfide conductive coating is formed and the phenol oligomer is converted or cured by polymerization to a polyphenol forming a protective material in the conductive nickel sulfide. The phenolic monomer or oligomer materials such as those noted above can be employed in the above solution at 1 to 2% concentration, by weight.

In preferred practice for the protection of conductive polypyrrole by means of a polyphenolic overcoating according to the invention, the phenolic material can be incorporated into the pyrrole solution or into the oxidant, e.g. ferric chloride solution, and a substrate such as fiberglass is then contacted with the solution. When a polypyrrole coating is obtained having the desired electrical conductivity, the conductive substrate is heated at 200°–300° F. to polymerize and cure the phenolic material to form a protective material in the conductive polypyrrole coating.

However, if desired, the polypyrrole conductive coating can be formed first on the substrate, e.g. fiberglass, and the conductive substrate then contacted as by dipping into the phenolic material, and the impregnated substrate heated as noted above to polymerize and cure the phenolic material to form a protective overcoating on the conductive polypyrrole coating.

When employing a silane as a protective material for the polypyrrole or nickel sulfide conductive coating, according to preferred practice the conductive coating is first formed on the substrate in the manner described above and the conductive substrate is then contacted or treated with a solution of the silane material. The silane material preferably is in form of a siloxane, examples of such siloxanes being (3-glycidoxypropyl)tri-methoxysilane, phenyltrimethoxysilane, vinyltrimethoxysilane and bis[3-(triethoxysilyl)propyl]amine. These siloxanes are applied in aqueous or organic solutions to the polypyrrole or nickel sulfide coated substrates by dipping the coated substrate into the treating solution of the siloxane or by spraying the treating solution on the conductive coated substrate. The substrate is then heated to a temperature in the range of about 200° to about 300° F., e.g. 250° F., to convert the siloxane to a polysiloxane protective overcoating on the polypyrrole or nickel sulfide coated substrate.

The protective polyphenolic or polysiloxane protective materials are applied to the conductive substrates prior to lamination thereof to form composite structural materials, to prevent loss of conductivity during shelf storage of the conductive substrates.

The following are examples of practice of the invention:

EXAMPLE I

Protection of Polypyrrole with Silane Overcoat (a) Impregnation of Polypyrrole into an Insulating Substrate Two solutions are necessary for the treatment to form polypyrrole. The first solution was made up of 20 gms of ferric chloride in 200 mls of acetone; the second solution consisted of 4 ml of pyrrole in 200 mls of pentane.

An insulating substrate, fiberglass, is dipped first into the ferric chloride solution, dried, and then dipped into the pyrrole solution and again dried. The time interval for each dipping is 5–10 minutes. Dipping in both solutions can be considered 1 cycle. Conductivity can be varied with the number of cycles. One cycle yields conductivities corresponding to a sheet resistivity of about 500 ohms/square; 4 cycles yields conductivities corresponding to a sheet resistivity of about 100 ohms/square. The term "ohms/square" is defined as the bulk resistivity of the sample in ohms x cm divided by the thickness in cm. Sheet resistivity is proportional to the reciprocal of electrical conductivity.

(b) Overcoating impregnated polypyrrole with a silane protective material

After the polypyrrole has been impregnated into the fiberglass substrate it is dipped for 5 minutes in a 1% solution of (3-glycidoxypropyl)trimethoxysilane in 95% methanol/5% water. After drying the overcoated substrate is heated at 250° F. for 30 minutes. The polysiloxane overcoated fiberglass-polypyrrole conductive cloth will remain electrically stable on the shelf indefinitely.

The protective overcoat can also be applied as a spray. A 1–2% solution of the silane in 95% methanol and 5% water is applied in a normal spraying apparatus. The final results are the same.

EXAMPLE II

Protection of Nickel Sulfide, $(NiS)_x$, with a Polyphenolic material

Impregnation and Protection of Nickel Sulfide in an Insulation Substrate

In this example only one solution is necessary. The solution is made up of 139 gms of nickel acetate, 46 gms of thiourea and 10 gms of Bordens phenolic resin #SC-1008 dissolved in 1 liter of methanol. An insulating substrate fiberglass is dipped into the solution for 5–10 minutes and dried. It is then heated in an oven at 400° F. for 30 minutes. The electrical conductivity of the polyphenol-containing fiberglass-nickel sulfide conductive cloth is 100 ohms/square. Its shelf life stability is indefinite.

This solution can also be applied to the fiberglass by spraying. The final results are the same as above.

EXAMPLE III

Protection of Nickel Sulfide $(NiS)_x$ with a Silane Overcoat (a) Impregnation of Nickel Sulfide in an Insulating Substrate The impregnation procedure here is the same as in Example II with the exclusion of the phenolic resin. The dried fiberglass-impregnated cloth is heated at 400° F. for 30 minutes to form nickel sulfide. The electrical conductivity of the coating at this point is 100 ohms/square.

(b) Overcoating impregnated nickel sulfide with a silane protective material

The fiberglass-nickel sulfide impregnated material is then dipped for 5 minutes in a 1–2% solution of bis[3-(triethoxysilyl)propyl]amine in 1 liter of 95% methanol-5% water solution. After drying the overcoated substrate is heated at 250° F. for 30 minutes. The electrical conductivity of the resulting polysiloxane overcoated fiberglass-nickel sulfide conductive cloth is 100 ohms/square, and its shelf life is stable indefinitely.

In this case again the protective silane coating can be applied as a spray. A 1–2% solution of the silane in 95% methanol-5% water is applied by spraying. The final results are the same as above.

EXAMPLE IV

Protection of Polypyrrole with a Polyphenolic Material

Two solutions are provided to form polypyrrole. The first solution was made up of 20 grams of ferric chloride in 200 mls of acetone, the second solution consisted of 4 ml of pyrrole and 1 ml of Borden's phenolic resin #SC-1008 dissolved in 200 mls of hexane and a slight amount, 2 mls, of acetone to aid solubility.

Fiberglass cloth is dipped first into the ferric chloride solution, dried, and then dipped into the pyrrole solution and again dried. The time interval for each dipping is 5–10 minutes. Dipping in both solutions can be considered 1 cycle. Conductivity can be varied with the number of cycles.

When the desired conductivity of about 100 ohms/square is obtained, the substrate is heated in an oven at 250° F. for 30 minutes. Its shelf life electrical conductivity is stable indefinitely.

Referring now to the drawing, it is shown that the shelf life stability of the silane protected nickel sulfide coating of Example III at room temperature for two levels of sheet resistivity in ohms/square remains substantially constant over a period of 30 days as compared to the stability of the neat nickel sulfide conductive coating produced in Example III but without applying the silane protective coating, step (b), and which sustains a gradual loss in conductivity (as indicated by an increase in sheet resistivity) measured in ohms/square) over the same period of time.

The conductive polypyrrole and nickel sulfide materials protected by a polyphenol or polysiloxane materials according to the invention have application not only for producing conductive laminates for composite structural materials, but also have application in resistive heating elements, semi-conductor components, in anti-static applications, in electromagnetic interference shielding applications, and as electrical conductors.

It is noted that in above U.S. application Ser. No. 394,260 there is disclosed the use of certain silanes, providing a pendant amino or mercapto group, as sizing agents for the dielectric substrate, such as fiberglass fabric, to enhance adherence of the nickel sulfide coating to the substrate. However there is no suggestion or disclosure in such application of the use of any such silanes as a protective material or overcoating for the nickel sulfide to enhance shelf life stability of the conductive nickel sulfide coatings.

From the foregoing, it is seen that the invention provides a simple method for enhancing shelf-life stability of conductive polypyrrole and nickel sulfide coatings on substrates, such as fiberglass fabric.

Since various changes and modifications will occur to and can be made readily by those skilled in the art without departing from the invention concept, the invention is not to be taken as limited except by the scope of the appended claims.

What is claimed is:

1. A coated substrate comprising
a substrate coated with
a conductive coating, said conductive coating comprising either polypyrrole or nickel sulfide and
either phenol-formaldehyde polymer or polysiloxane.

2. The coated substrate of claim 1, wherein said conductive coating comprises nickel sulfide and a phenol-formaldehyde polymer.

3. The coated substrate of claim 1, wherein said conductive coating comprises polypyrrole and a phenol-formaldehyde polymer.

4. The coated substrate of claim 1, wherein said polysiloxane is derived from a silane selected from the group consisting of (3-glycidoxypropyl) trimethoxysilane, pheyltrimethoxysilane, vinyltrimethoxysilane and bis[3-(triethoxysilyl)-propyl]amine.

5. A coated substrate comprising a substrate coated with a polypyrrole or nickel sulfide and overcoated with polysiloxane.

* * * * *